United States Patent [19]

McKelvey

[11] 4,422,916
[45] * Dec. 27, 1983

[54] MAGNETRON CATHODE SPUTTERING APPARATUS

[75] Inventor: Harold E. McKelvey, Plymouth, Mich.

[73] Assignee: Shatterproof Glass Corporation, Detroit, Mich.

[*] Notice: The portion of the term of this patent subsequent to Oct. 26, 1999, has been disclaimed.

[21] Appl. No.: 347,699

[22] Filed: Feb. 11, 1982

Related U.S. Application Data

[63] Continuation-in-part of Ser. No. 233,974, Feb. 12, 1981, Pat. No. 4,356,073.

[51] Int. Cl.$^3$ .............................................. C23C 15/00
[52] U.S. Cl. .................................. 204/192 R; 204/298
[58] Field of Search ................. 204/192 R, 192 C, 298

[56] References Cited

U.S. PATENT DOCUMENTS 4,356,073 10/1982 McKelvey ..................... 204/192 R Primary Examiner—Aaron Weisstuch
Attorney, Agent, or Firm—William E. Nobbe

[57] ABSTRACT

A rotatable magnetron cathode sputtering apparatus for operation in an evacuable chamber for sputter coating substantially planar substrates as they move through said chamber. The cathode comprises an elongated, cylindrical tubular member having a layer of the coating material to be sputtered applied to the outer surface thereof. Magnetic means are mounted within the tubular member and includes at least one row of permanent magnets extending lengthwise thereof. The tubular member is horizontally mounted in the coating chamber for rotation about its longitudinal axis either in a step-by-step fashion or continuously, relative to the magnets to bring different portions of the coating material into sputtering position opposite said magnets and within the sputter coating zone.

12 Claims, 14 Drawing Figures

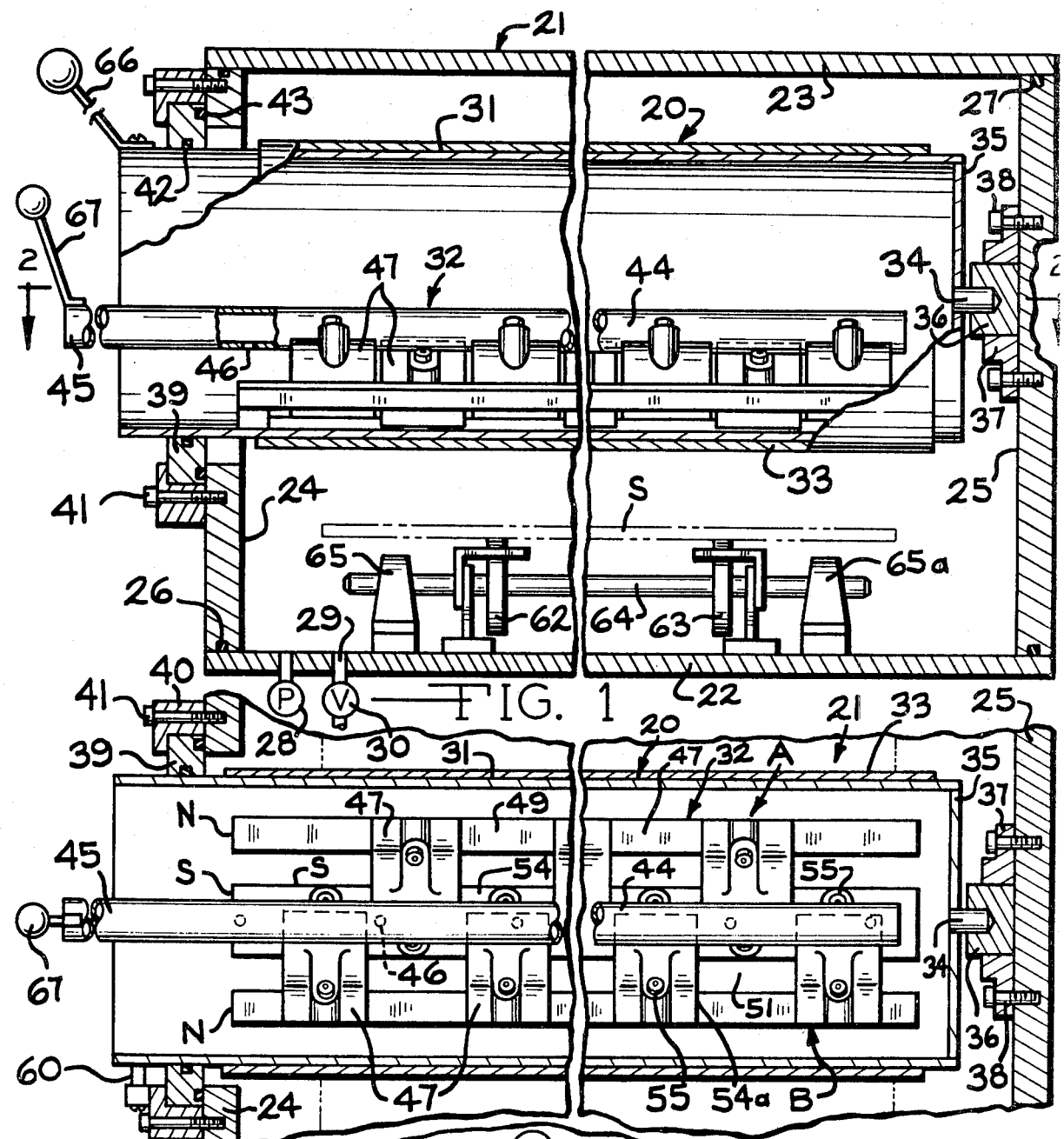
FIG. 1
FIG. 2
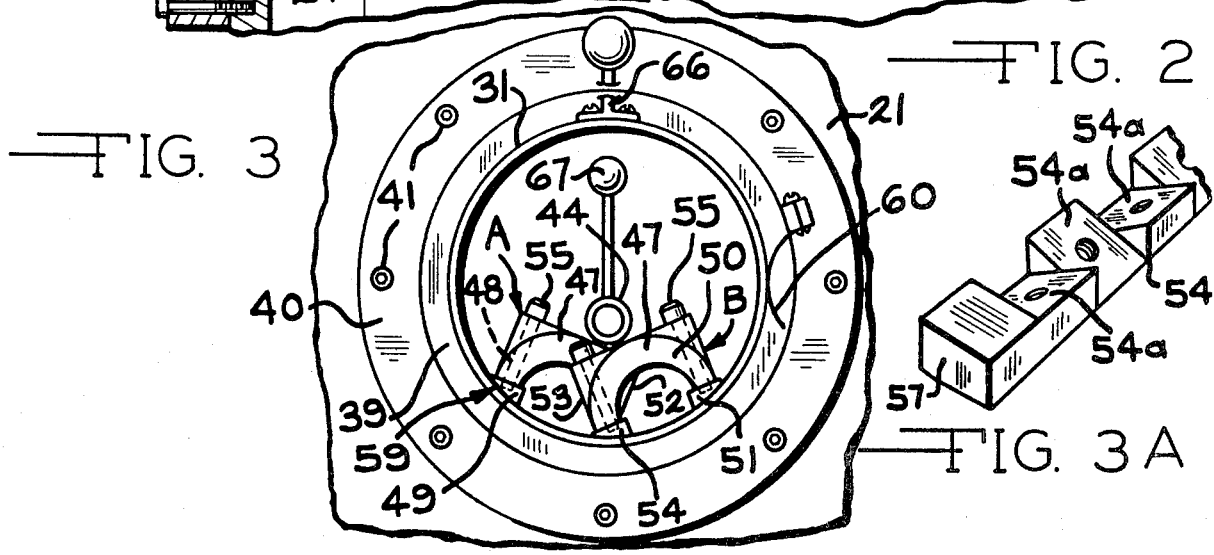
FIG. 3
FIG. 3A

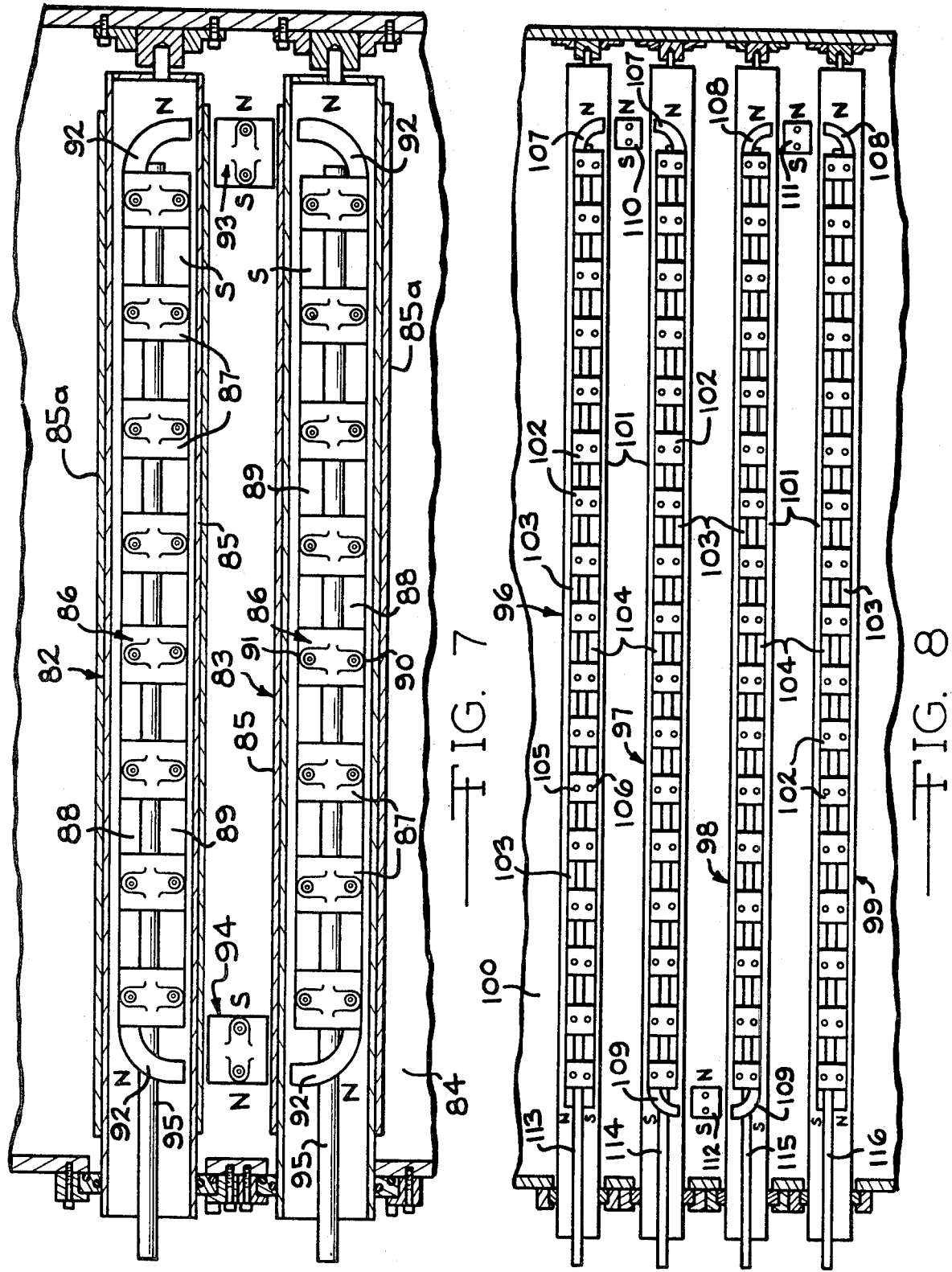

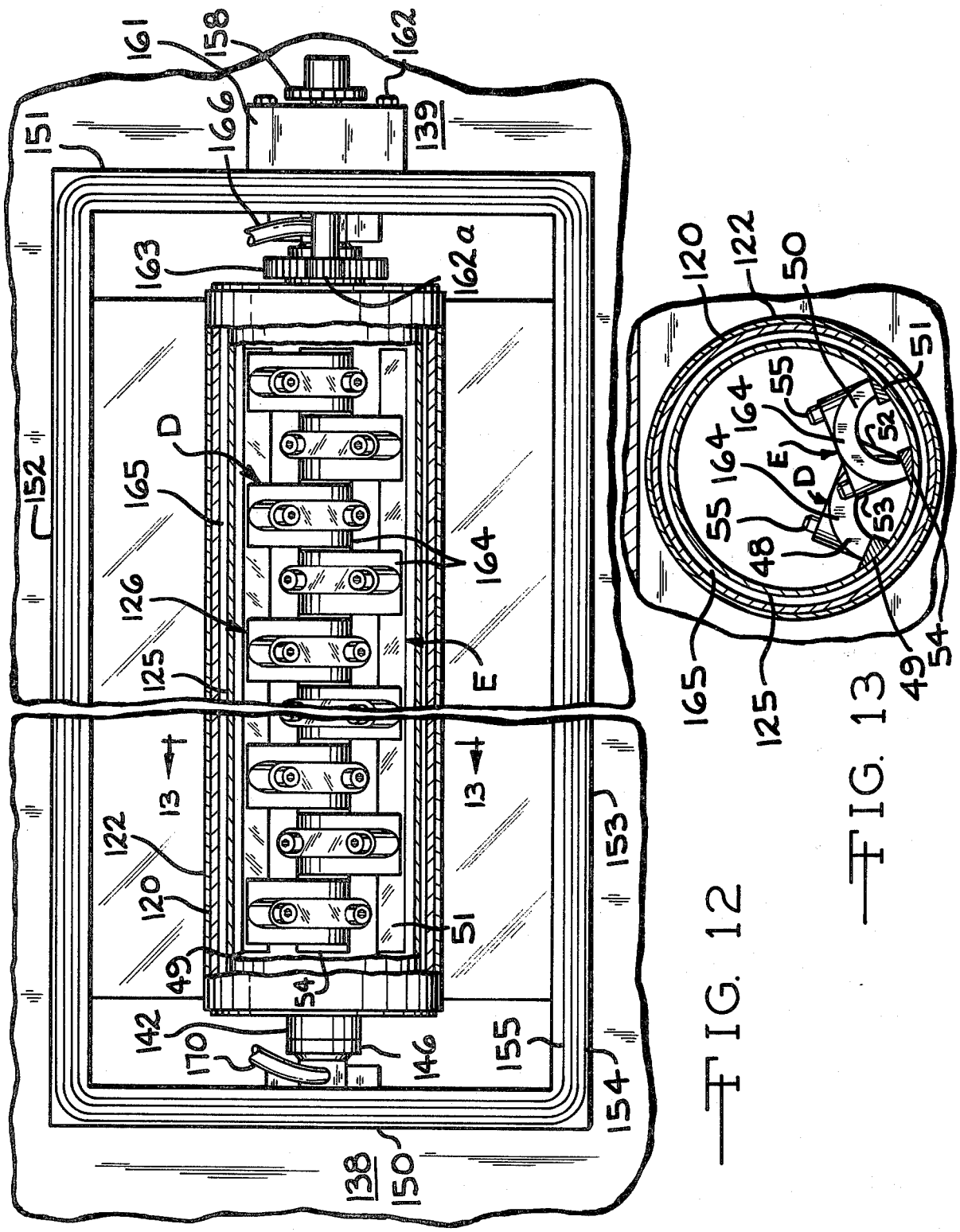

MAGNETRON CATHODE SPUTTERING APPARATUS

BACKGROUND OF THE INVENTION

This application is a continuation-in-part of application, filed Feb. 12, 1981, Ser. No. 06/233,974, now U.S. Pat. No. 4,356,073.

The present invention relates broadly to apparatus for cathode sputtering and more particularly to an improved magnetron cathode sputtering system.

Cathode sputtering is widely used for depositing thin films of material onto substrates. Such a process involves generally ion bombarding a flat target plate of the material to be sputtered in an ionized gas atmosphere in an evacuable coating chamber in which a controlled vacuum is maintained to cause particles of the target plate material to be dislodged and deposited as a thin film on the substrate being coated. The target plate, to which a layer of the coating material to be sputtered is applied, is generally of elongated, rectangular form, with the substrate to be coated being moved either continuously or intermittently therebeneath. The longitudinal axis of the target plate is transverse to the direction of substrate movement.

In an endeavor to attain increased deposition rates, the use of magnetic enhanced cathodes has been proposed. Such cathodes are known as planar magnetron cathodes and customarily include an array of permanent magnets arranged in a closed loop and mounted in a fixed position in relation to the flat target plate. Thus, the magnetic field is caused to travel in a closed loop, commonly referred to as a "race track" which establishes the path or zone along which sputtering or erosion of the target plate material takes place.

One drawback of the conventional flat plate target, however, is that the race track along which sputtering takes place is relatively narrow so that erosion occurs in a relatively narrow ring-shaped region corresponding to the shape of the closed loop magentic field. As a result, only a relatively small portion of the total target material in the so-called race track region is consumed before the target must be replaced.

SUMMARY OF THE INVENTION

The present invention contemplates a new and novel form of magnetron cathode which is significantly different from the planar magnetron cathodes heretofore proposed and which, while retaining the advantages of high deposition rates, also renders possible an even more effective and maximum utilization of the target material, thereby substantially increasing the operating life thereof.

According to the invention, the cathode assembly comprises an elongated, cylindrical rotatable tube or tubular member having a layer of the target material to be sputtered applied to the outer surface thereof. Magnetic means including an array of U-shaped permanent magnets is arranged inside the tube, with the opposite legs of the magnets being secured to spaced, parallel magnetic strips running lengthwise of the tube. In one form of the invention, the tube is rotatable about its longitudinal axis in a step-by-step fashion so that it can be turned relative to the magnets to selectively bring different portions of the target material on the outer surface thereof into sputtering position opposite the magnets and within the sputtering zone. Also different coating materials can be applied to different portions of the outer surface of the rotatable tube so that by turning the tube a particular selected coating material can be brought into sputtering position. In another form of the invention, the target tube can be continuously rotated. Means are also provided for internally cooling the cathode.

These and other features and advantages of the invention will be apparent from the following description, with reference to the accompanying drawings.

BRIEF DESCRIPTION OF THE DRAWINGS

FIG. 1 is a vertical longitudinal section through a coating chamber showing in elevation a magnetron cathode constructed in accordance with the present invention mounted therein, FIG. 2 is a horizontal longitudinal section taken substantially on line 2—2 of FIG. 1, FIG. 3 is an end view of FIG. 1, FIG. 3A is a perspective view of a portion of one of the magnetic strips, FIG. 12 is a horizontal section taken substantially on line 12—12 of FIG. 9, and FIG. 13 is a transverse section taken substantially on line 13—13 of FIG. 12.

DETAILED DESCRIPTION OF THE INVENTION

Figure 4:
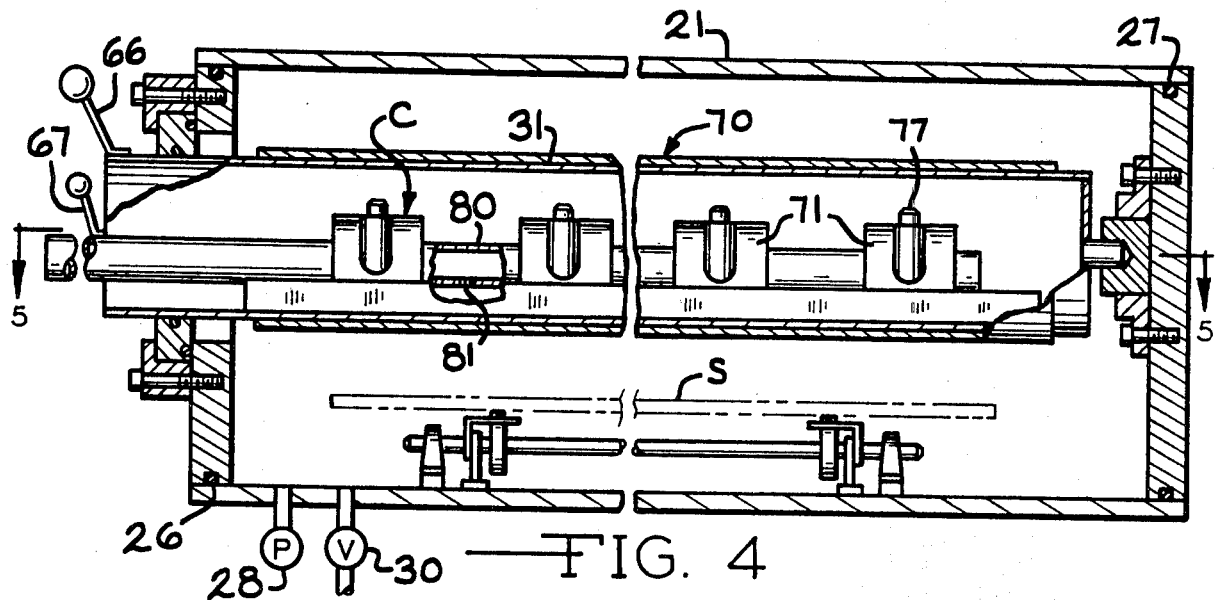
FIG. 4 is a view similar to FIG. 1 illustrating another embodiment of the invention.

One form of the invention is illustrated in FIGS. 1 to 8 of the invention and a second form illustrated in FIGS. 9 to 13. Referring to that form of the invention shown in FIGS. 1 to 8, and particularly to the embodiment illustrated in FIGS. 1, 2 and 3, the cathode assembly is designated by the numeral 20 and is mounted in an evacuable coating chamber 21. The coating chamber is rectangular and is composed of a bottom wall 22, top wall 23, opposite side walls 24 and 25 and end walls (not shown). The bottom and top walls 22 and 23 are suitably joined to the side walls 24 and 25 at the hermetic seals 26 and 27 respectively. The end walls are similarly sealed to the top and bottom and side walls. A vacuum pump 28 is provided to evacuate the coating chamber 21 to the desired pressure. Should it be desired to inject gases into the chamber, it may be done through conduit 29 controlled by a valve 30.

The cathode assembly 20 comprises generally an elongated, cylindrical tube 31 mounted horizontally in the coating chamber 21 and in the lower portion of which is mounted the magnetic means 32. The tube 31 is formed of a suitable non-magnetic material such as, for example, brass or stainless steel and is of a diameter, wall thickness and length required for the operation to be performed.

Applied to the outer surface of the tube 31 is a layer 33 of a selected coating or target material to be deposited onto the substrates being coated. Thus, the tube 31 and layer of coating material 33 constitute a tubular target or sputtering source as distinguished from the conventional planar target.

The tube 31 is supported in a horizontal position in the coating chamber 21 and is mounted for rotation about its longitudinal axis. For this purpose, the tube is supported at its inner end by a trunnion 34 secured to the closed inner end 35 of the tube and journaled in a bearing block 36 carried by a bracket 37 secured to the side wall 25 of the coating chamber be screws 38.

The tube 31 is open at its outer end and extends through a opening in the side wall 24 of the coating chamber 21, where it is supported in an annular ring 39 surrounded by a collar 40 secured to said side wall 24 by screws 41. The interior of the coating chamber is sealed from the atmosphere by O-rings 42 and 43 engaging the tube 31 and side wall 24 of the coating chamber respectively.

To provide the requisite cooling of the cathode assembly there is provided a coolant conduit 44 also of a suitable non-magnetic material extending longitudinally in the lower portion of the tube 31. The inner end of said conduit is closed and spaced from the closed inner end 35 of tube 31, while the outer end thereof extends beyond the tube as indicated at 45. A suitable coolant, such as water, is introduced into the outer end of the conduit 44 and, after passing through openings 46 therein, circulates throughout the tube 31 and exits at the outer end thereof.

The magnetic means 32 comprises an array of U-shaped permanent magnets 47 arranged in two straight parallel rows A and B that extend lengthwise within the tube 31. The magnets in each row are aligned with one another, with the magnets in one row being disposed alternately with and overlapping the magnets in the other row. Also the magnets in the two rows A and B are arranged at an angle relative to one another, as shown in FIG. 3, and are secured to the conduit 44 by suitable brackets or the like.

The outer legs 48 of the magnets 47 in row A engage a longitudinally extending, relative narrow strip 49 of a suitable magnetic material, such as hot rolled mild steel, while the outer legs 50 of the magnets in row B engage a similar magnetic strip 51 arranged parallel with magnetic strip 49. The inner legs 52 and 53 of the magnets in rows A and B overlap one another and engage a central longitudinally extending magnetic strip 54 that extends parallel with the outer magnetic strips 49 and 51. The magnets 47 are secured to the respective magnetic strips by screws 55 passing therethrough to tie them together as a unit. The bottom surfaces 59 fo the magnetic strips 49, 51 and 54 are shaped to conform to the curvature of the inner surface of the tube 31. The central magnetic strip 54 is notched on a slant alternately first to one side and then the other, as indicated at 54a in FIG. 3A, such that the inner legs 52 and 53 of the magnets will make face-to-face contact with said strip.

The magnets 47 are preferably disposed so that the north poles thereof engage the outer magnetic strips 49 and 51, while the south poles of the magnets engage the central magnetic strip 54. This arrangement of the magnets and magnetic strips establishes two straight magnetic fields along which erosion of the target material 33 takes place.

A cathode potential sufficient to cause sputtering to occur is supplied to the tubular target from a D.C. power source (not shown) through a power line 60 having sliding contact with the tube 31. The apparatus is grounded in any suitable manner.

The substrates S to be coated are supported on and carried through the coating chamber 21 and beneath the cathode 20 by rollers 62 and 63 keyed to a horizontal shaft 74 journaled in bearing blocks 75 and 65a supported on the bottom of the coating chamber.

As stated above, the outer surface of the tube 31 is provided with a layer 33 of the material to be sputtered on the substrates S as they pass therebeneath. By means of the handle 66 secured to the outer end of the tube 31 the tube can be rotated either clockwise or counterclockwise about its longitudinal axis to position a selected portion of the coating material to be sputtered directly opposite the magnets and within the sputter-coating zone. When this portion of the coating material has been depleted, the tube can again be rotated to bring another and fresh portion of the target material into sputtering position. This procedure can be repeated until a maximum amount of the target material has been utilized.

Also by applying different coating materials to different portions of the outer surface of the rotatable tube a particular selected coating material can be brought into sputtering position. In this way, it is possible to sputter different coatings onto the substrates from a single target.

The magnetic means 32 are supported on the tube 31, with the magnetic strips 49, 51 and 54 in direct contact with the inner surface thereof. With such an arrangement, upon rotation of the tube 31, and due to the frictional contact between the tube and the magnetic strips, the magnets may be moved slightly with the tube from their original position relative to that portion of the coating material to be sputtered. Should this occur, it can be readily corrected and the magnets returned to their original position by turning the conduit 44, by means of the handle 67 secured to the outer end thereof, to move the magnets in the reverse direction.

Figure 5:
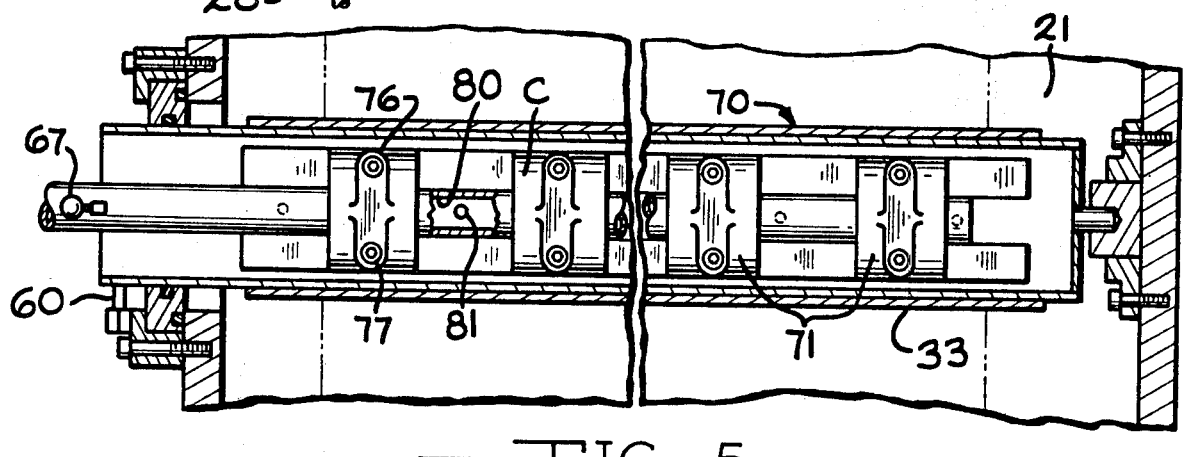
FIG. 5 is a horizontal longitudinal section taken substantially on line 5—5 of FIG. 4.
Figure 6:
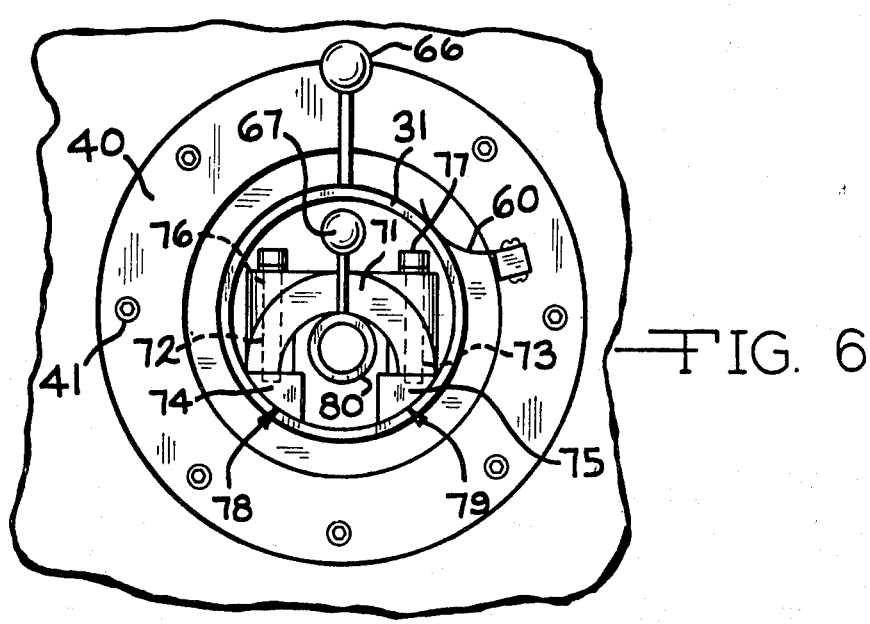
FIG. 6 is an end view of FIG. 4, FIGS. 7 and 8 are generally schematic plan views illustrating two other modified embodiments of the invention.
Figure 9:
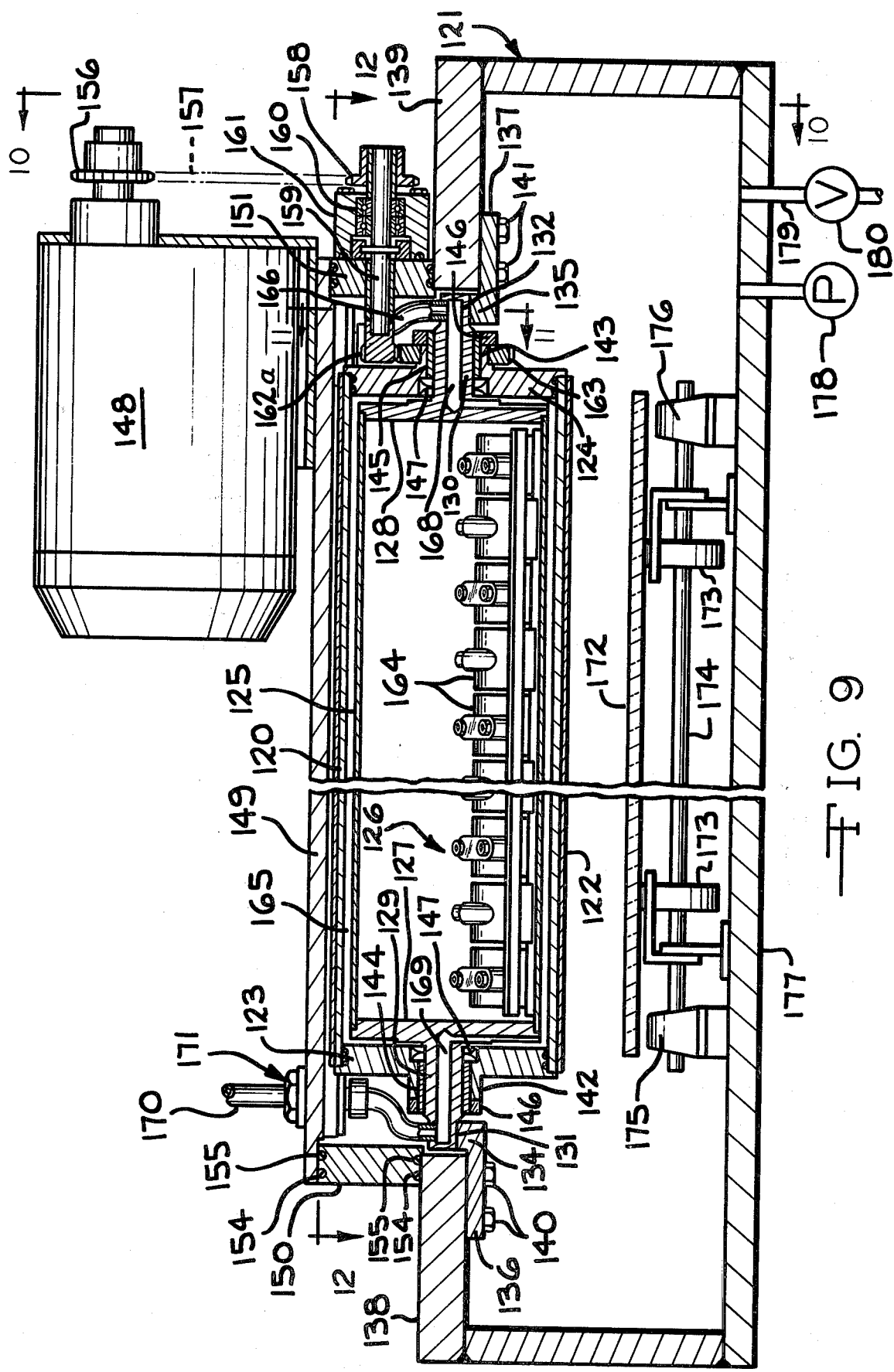
FIG. 9 is a vertical longitudinal sectional view of another form of the invention.

FIGS. 4, 5 and 6 are views similar to FIGS. 1, 2 and 3 respectively but disclose an alternate form of magnetic means 70. Otherwise, the construction and operation of the apparatus are the same as above described with reference to FIGS. 1, 2 and 3 and the same numerals are used to designate like parts.

In this form of the invention, the magnetic means 70 is composed of a single row C of permanent U-shaped magnets 71, the legs 72 and 73 of which engage spaced, longitudinally extending magnetic strips 74 and 75 respectively and are secured thereto by screws 76 and 77. The bottom surfaces 78 and 79 of the magnetic strips 74 and 75 are shaped to conform to the curvature of the inner surface of the tube 31. In this embodiment, the magnetic field provided also follows a straight path to create a straight erosion pattern on the target material.

Extending longitudinally within the tube 31 and beneath the row of magnets 71 is a coolant conduit 80 to which the magnets are secured. A cooling liquid, such as water, is introduced into the outer end of the conduit and discharged therefrom through openings 81 into the tube. The cooling liquid, after circulating within the tube 31, exits therefrom through the outer end thereof.

The tube 31 can also be rotated by means of the handle 66 to selectively position different portions of the coating material opposite the magnets and within the sputter coating zone. Likewise, after the tube has been turned to place the selected unused portion of the coating material in sputtering position, the magnetic means can be adjusted, if necessary, by means of the handle 67 to again bring the magnets into proper position relative to that portion of the coating material to be sputtered.

In FIGS. 7 and 8 are illustrated in somewhat schematic form two other modified embodiments of the invention. In FIG. 7, two spaced parallel cathodes 88 are mounted in a coating chamber 84. Each cathode comprises an elongated, cylindrical tube 85 having a layer of the coating material 85a applied to the outer surface thereof. Located in the tube 85 are the magnetic means 84 composed of a single row of permanent U-shaped magnets 87, the opposite legs of which engage longitudinally extending magnetic strips 88 and 89 and are secured thereto by screws 90 and 91 respectively.

The outer magnetic strips 88 constitute the north pole pieces and the inner magnetic strips 89 south pole pieces. The outer magnetic strips 88 extend beyond the inner magnetic strips 89 and are turned inwardly toward one another as indicated at 92. Positioned between the cathodes 82 and 83 at the opposite ends thereof are the additional permanent U-shaped magnets 93 and 94 which bridge the gap between the inturned ends 92 of the magnetic strips 88 and in conjunction therewith establish a magnetic field in the form of a closed loop or race track. The cathodes 82 and 83 are internally cooled by the introduction of a cooling liquid into the coolant conduits 95 as above described with reference to FIGS. 1, 2 and 3.

The tubes 85 of the cathodes 82 and 83 are independently rotatable to bring the desired unused portion of the coating material on the outer surface thereof into proper registration with the respective row of magnets. Either the same or different types of coating materials can be applied to the tubes.

The embodiment of the invention illustrated in FIG. 8 distinguishes from that disclosed in FIG. 7 in that four cathodes 96, 97, 98 and 99 are mounted in horizontally spaced, parallel relation in the coating chamber 100. These cathode assemblies are of the same type shown in FIG. 7, with each comprising an elongated, cylindrical tube 101 having a layer of the material to be sputtered applied to the outer surface thereof. Also the magnetic means within the tube 85 of each cathode is composed of a single row of permanent U-shaped magnets 102, the opposite legs of which engage and are secured to the magnetic strips 103 and 104 by screws 105 and 106 respectively.

The magnetic strips 103 constitute north pole pieces, while the magnetic strips 104 constitute south pole pieces. The magnetic strips 103 of cathodes 96–97 and 98–99 extend at one end beyond the associated strips 104 and are turned inwardly as indicated at 107 and 108 respectively. On the other hand, the magnetic strips 104 of the magnets 97 and 98 extend beyond the magnetic strips 103 at the other end of the row of magnets and are turned inwardly toward one another as indicated at 109.

Located between the inturned ends 107 of magnetic strips 103 of cathodes 96 and 97 is a permanent U-shaped magnet 110 and a similar magnet 111 is positioned between the inturned ends 108 of the magnetic strips 103 of cathodes 98 and 99. Also positioned between the inturned ends 109 of the magnetic strips 104 of magnets 97 and 98 is a like permanent magnet 112. The individual magnets 110, 111 and 112 at the opposite ends of the cathodes serve to bridge the gaps between the associated magnetic strips and in conjunction therewith act to complete the magnetic field which follows a serpentine path.

The tubes 101 of the cathodes 96, 97, 98 and 99 are mounted in the coating chamber 100 for individual rotation relative to one another and may be provided with the same or different types of coating materials. The cathodes are also adapted to be internally cooled as described above through the coolant conduits 113, 114, 115 and 116 to which the associated magnets are secured.

SECOND FORM OF THE INVENTION

A second form of the invention is illustrated in FIGS. 9 to 13 and distinguishes, in essence, from the previous embodiments in that, whereas in those embodiments the tubular target is rotated about its longitudinal axis in a step-by-step fashion, this embodiment contemplates a tubular target that is continuously rotated during the sputter-coating operation.

With reference particularly to FIGS. 9 to 13, the cathode therein disclosed comprises an elongated, cylindrical tube or tubular member 120 mounted for horizontal rotation about its longitudinal axis in the upper portion of an evacuable coating chamber 121 and having applied to the outer surface thereof a layer 122 of the coating material to be sputtered. The tube 120 is provided at its opposite ends with the end walls 123 and 124 and constitutes a rotatable target.

Mounted in the tubular target 120, in spaced concentric relation thereto, is a relatively smaller elongated, cylindrical tubular member 125, in which the magnetic means 126 are located. The inner tube 125 is closed at its opposite ends by the end walls 127 and 128 which are provided with trunnions 129 and 130 respectively, said trunnions projecting through openings in the end walls 123 and 124 respectively of the tube 120.

The trunnions 129 and 130 are provided with reduced squared end portions 132 and 132 respectively that are supported in correspondingly shaped recesses 133 (FIG. 11) formed in supporting brackets 134 and 135. These brackets have portions 136 and 137 respectively that extend outwardly beneath horizontal walls 138 and 139 forming a part of the coating chamber 121 and are secured thereto by screws 140 and 141. With such an arrangement, the inner tube 125 is maintained in a fixed position and rotation thereof prevented, while the outer target tube 120 is rotated relative thereto.

To effect rotation of the tubular target 120 the end walls 123 and 124 thereof are, as previously mentioned, provided centrally thereof with openings through which the trunnions 129 and 130 of the inner tube 125 pass. Surrounding these openings are the outwardly directed annular flanges 142 and 143 that receive the bearing sleeves 144 and 145 fitting over the trunnions 129 and 130. Endwise movement of the tubular target 120 is prevented by the rings 146 engaging the annular flanges 142 and 143, while hermetic seals 147 are provided inwardly of said bearing sleeves 144 and 145.

As noted above, the tubular target member 120 is mounted for continuous rotation during the coating operation. The drive means therefor includes a motor 148 mounted upon the top wall 149 of the coating chamber 121, said top wall being supported at its opposite sides by the vertical walls 150 and 151 of the coating chamber. The top wall is also supported by the coating chamber end walls 152 and 153. O-rings 154 and 155 are located between the top wall 149 and said vertical side and end walls as well as between said vertical walls 150 and 151 and the horizontal walls 138 and 139 of the coating chamber.

Figure 10:
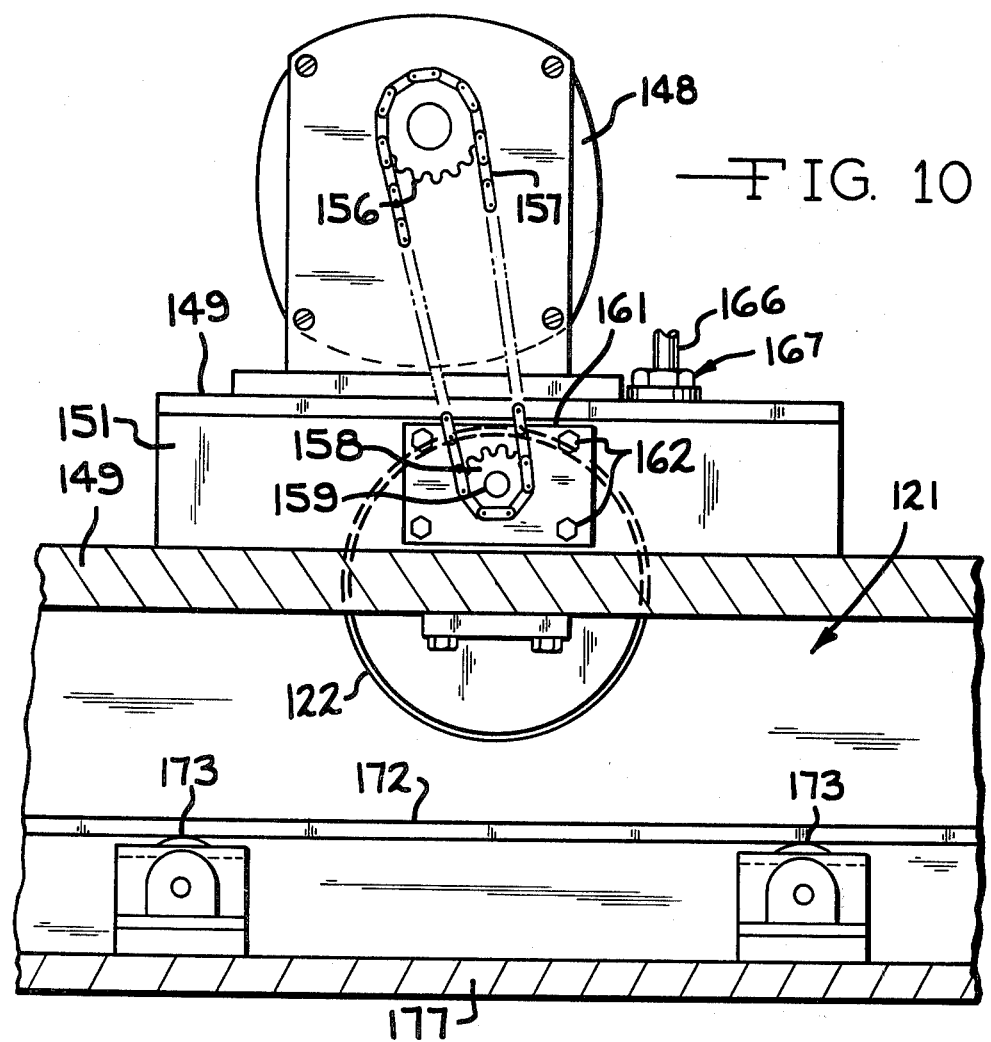
FIG. 10 is a vertical section taken substantially on line 10—10 of FIG. 9.

Keyed to the drive shaft of the motor is a sprocket gear 156 about which is trained a sprocket chain 157 which is also trained about a sprocket gear 158 keyed to a horizontal shaft 159. This shaft is journaled in bearings 160 mounted in a bearing block 161 secured to the vertical wall 151 of the coating chamber by machine screws 162 (FIG. 10). The shaft 159 projects through an opening in the vertical wall 151 and has keyed to the inner end thereof a gear 162*a* meshing with a gear 163 keyed to the annular flange 143 on vertical wall 124 of the tubular target 120. Upon operation of the motor 148 the target member will be rotated through the gears 162*a* and 163, while the inner tube 125 remains stationery.

The magnetic means 126 are supported in the inner tube 125 and comprises an array of substantially U-shaped permanent magnets 164 arranged in two straight parallel rows D and E extending lengthwise of the tube 125. The form and arrangement of these magnets are the same as described above with reference to FIGS. 1, 2 and 13 and such disclosure is included here by reference. Similar numerals are used to designate like parts.

Figure 11:
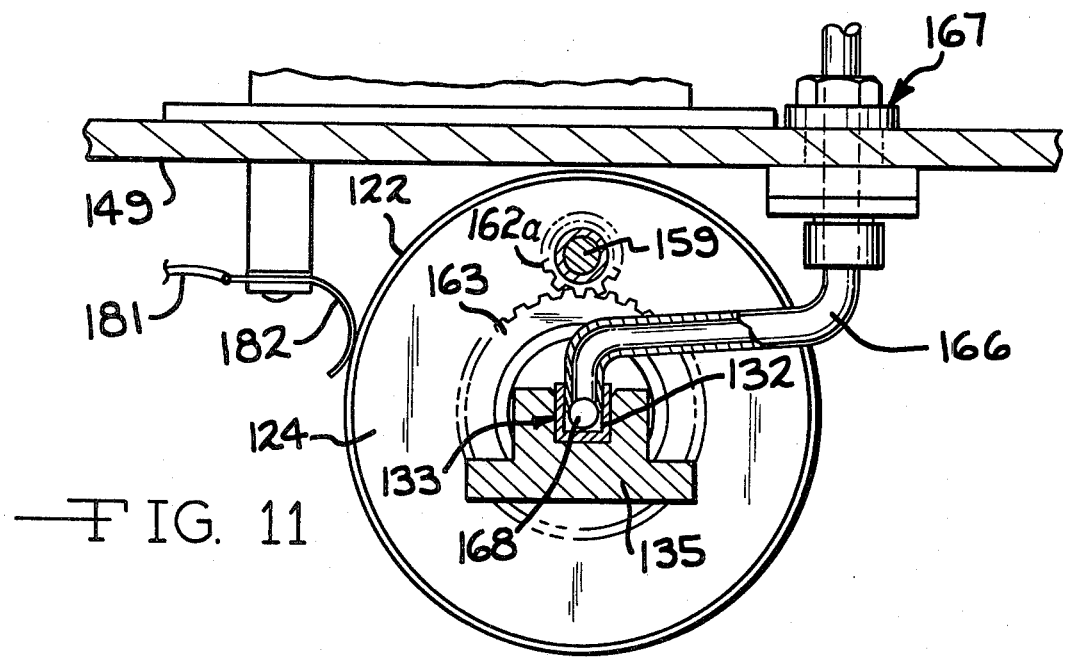
FIG. 11 is a vertical section taken substantially on line 11—11 of FIG. 9.

The cathode is adapted to be internally cooled and for this purpose a cooling medium, such as water, is circulated through the space 165 between the outer and inner tubular members 120 and 125 along their length and also at the ends thereof. The incoming cooling medium is supplied by a feed pipe 166 supported by the top wall 149 of the coating chamber as indicated at 167 (FIG. 11). The feed pipe feeds the into the outer end of a passageway 168 formed in the trunnion 130 and is discharged into the space 165 at the adjacent end of the cathode. After circulating within the space 165 the cooling medium is discharged at the opposite end of the cathode through a passageway 169 in trunnion 129 which leads to a discharge pipe 170 supported by the top wall 149 of the coating chamber as indicated at 172.

The planar substrates 172 to be sputter-coated are supported on and carried horizontally through the coating chamber 121 and beneath the cathode by the conveyor rollers 173 keyed to horizontal shafts 174 journaled in bearing blocks 175 and 176 supported on the bottom 177 of the coating chamber. A vacuum pump 178 is provided to evacuate the coating chamber to the desired pressure. Should it be desired to inject gasses into the chamber it may be done through conduit 179 controlled by a valve 180.

As pointed out above, the outer tubular member 120 is adapted to be rotated continuously during the sputtering operation. Simultaneously, the substrates 172 will be passed horizontally beneath the cathode to receive the coating material sputtered from the target 120. The longitudinal axis of the tubular target 120 is transverse to the direction of substrate movement. A cathode potential sufficient to cause sputtering to occur is applied to the target material from a D.C. power source (not shown) through a power line 181 secured to a contact 182 having sliding engagement with the target 120.

While there has been illustrated and described herein preferred embodiments of the invention, it will be understood that changes and modifications may be made without departing from the spirit and scope of the claims.

I claim:

1. In apparatus for sputtering thin films of a selected coating material upon substantially planar substrates, an evacuable coating chamber, a cathode mounted horizontally in said coating chamber comprising an elongated, cylindrical tubular member having a layer of the coating material to be sputtered applied to the outer surface thereof, magnetic means located in said tubular member for providing a sputtering zone extending lengthwise thereof, means for rotating said tubular member about its longitudinal axis to bring different portions of the coating material into sputtering position opposite said magnetic means and within said sputtering zone, and means in the coating chamber for horizontally supporting the substrates and for transporting them past the magnetic means to receive the sputtered material.

2. In apparatus as claimed in claim 1, in which the means for rotating said tubular member rotates the same continuously during the sputter-coating operation.

3. In apparatus as claimed in claim 2, including a second elongated, tubular member mounted in fixed position within said tubular member in spaced concentric relation thereto, and means for circulating a cooling medium between said first and second tubular members.

4. In apparatus as claimed in claim 3, in which said first tubular member is provided with end walls, in which said second tubular member is also provided with end walls spaced from the end walls of said first tubular member, and including means for introducing said cooling medium into the space between said first and second tubular members at one end thereof, and means for withdrawing said cooling medium from said space at the opposite end of said second tubular member.

5. In apparatus as claimed in claim 3, in which said magnetic means comprises a plurality of permanent magnets supported in a fixed position within said second tubular member and extending lengthwise thereof.

6. In apparatus as claimed in claim 1, in which the means for rotating said tubular member rotates the same in a step-by-step manner.

7. In apparatus as claimed in claim 6, in which said tubular member is closed at one end and open at the opposite end, and including a conduit extending longitudinally within said tubular member for receiving a cooling medium in one end thereof and for discharging it through openings therein into said tubular member from which it exits at the opposite end.

8. In apparatus as claimed in claim 1, including means for internally cooling said tubular member.

9. In apparatus as claimed in claim 1, in which said magnetic means comprises an array of individual magnets arranged in at least one row extending lengthwise of said tubular member.

10. In apparatus as claimed in claim 9, in which said magnets are substantially U-shaped magnets, and including magnetic strips extending longitudinally within said tubular member and engaged by the legs of said magnets, and means for securing said magnets to said magnetic strips.

11. In apparatus as claimed in claim 9, in which said magnetic strips are arranged in face-to-face relation with said tubular member, and in which the surfaces of said magnetic strips facing said tubular member are shaped to conform to the curvature of the inner surface thereof.

12. The method of sputtering thin films of a selected coating material upon substantially planar substrates, comprising providing an elongated, cylindrical tubular member having a layer of the target material to be sputtered applied to the outer surface thereof, providing within said tubular member a magnetic field defining the length and width of the erosion zone on the target material, rotating said tubular member continuously about its longitudinal axis during the sputtering operation to bring different portions of the target material within the erosion zone for sputtering, and simultaneously moving the planar substrates past said erosion zone to receive the material being sputtered.

* * * * *